(12) United States Patent
Chooi et al.

(10) Patent No.: US 6,486,080 B2
(45) Date of Patent: Nov. 26, 2002

(54) METHOD TO FORM ZIRCONIUM OXIDE AND HAFNIUM OXIDE FOR HIGH DIELECTRIC CONSTANT MATERIALS

(75) Inventors: Simon Chooi, Singapore (SG); Wenhe Lin, Singapore (SG); Mei Sheng Zhou, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/726,656

(22) Filed: Nov. 30, 2000

(65) Prior Publication Data

US 2002/0064970 A1 May 30, 2002

(51) Int. Cl.[7] .................... H01L 21/31; H01L 21/469
(52) U.S. Cl. ............................. 438/785; 438/765
(58) Field of Search .......................... 438/287, 591, 438/765, 769, 775, 778, 783, 784, 785, 786, 762, 799

(56) References Cited

U.S. PATENT DOCUMENTS

| | | | | |
|---|---|---|---|---|
| 4,504,113 A | * | 3/1985 | Baak | 350/96.33 |
| 4,772,370 A | * | 9/1988 | Kreider | 204/192.15 |
| 5,258,204 A | * | 11/1993 | Wernberg et al. | 427/255 |
| 5,290,609 A | | 3/1994 | Horiike et al. | 427/576 |
| 5,405,805 A | | 4/1995 | Homma | 437/195 |
| 5,443,686 A | | 8/1995 | Jones et al. | 216/37 |
| 5,487,918 A | | 1/1996 | Akhtar | 427/255.3 |
| 5,733,661 A | | 3/1998 | Ue et al. | 428/426 |
| 6,013,553 A | | 1/2000 | Wallace et al. | 438/287 |
| 6,020,024 A | | 2/2000 | Maiti et al. | 427/248.1 |
| 6,207,589 B1 | * | 3/2001 | Ma et al. | 438/785 |

OTHER PUBLICATIONS

B. Chang et al., "The Impact of High–k Gate Dielectrics and Metal Gate Electrodes on Sub–700 nm MOSFET's," vol. 46, No. 7, pp. 1537–1544.

B.H. Lee et al. "Ultrathin Hafnium Oxide with Low Leakage and Excellent Reliability for Alternative Gate Dielectric Application," IEDM Technical Digest, pp. 133–136, (1999).

W. Qi et al. "MOSCAP and MOSFET characteristics using $ZrO_2$ gate dielectric deposited directly on Si", IEDM Technical Digest, pp. 145–148, (1999).

* cited by examiner

Primary Examiner—David Nelms
Assistant Examiner—Phuc T. Dang
(74) Attorney, Agent, or Firm—George O. Saile; Rosemary L. S. Pike; Douglas R. Schnabel

(57) ABSTRACT

A new method of forming a metal oxide high dielectric constant layer in the manufacture of an integrated circuit device has been achieved. A substrate is provided. A metal oxide layer is deposited overlying the substrate by reacting a precursor with an oxidant gas in a chemical vapor deposition chamber. The metal oxide layer may comprise hafnium oxide or zirconium oxide. The precursor may comprise metal alkoxide, metal alkoxide containing halogen, metal β-diketonate, metal fluorinated β-diketonate, metal oxoacid, metal acetate, or metal alkene. The metal oxide layer is annealed to cause densification and to complete the formation of the metal oxide dielectric layer in the manufacture of the integrated circuit device. A composite metal oxide-silicon oxide ($MO_2$-$SiO_2$) high dielectric constant layer may be deposited using a precursor comprising metal tetrasiloxane.

20 Claims, 2 Drawing Sheets

METHOD TO FORM ZIRCONIUM OXIDE AND HAFNIUM OXIDE FOR HIGH DIELECTRIC CONSTANT MATERIALS

BACKGROUND OF THE INVENTION

1. Field of the Invention

The invention relates to a method of fabricating semiconductor structures, and more particularly, to a method of forming zirconium oxide, hafnium oxide, composite hafnium oxide-silicon oxide and composite zirconium oxide-silicon oxide in the manufacture of an integrated circuit device.

2. Description of the Prior Art

Semiconductor devices such as field effect transistors (FET) and random access memories (RAM) are common in the microelectronics industry. Performance of a MOSFET device can be enhanced in several ways. For example, the length of the gate electrode may be reduced. Alternatively, the thickness of the gate dielectric can be reduced. Either way, the MOSFET device performs faster.

The typical material for the gate dielectric is silicon dioxide. Continued scaling of CMOS technology toward 100 nanometer and lower feature sizes has caused a progressive reduction of the gate oxide to less than 60 Angstroms. There are several negative aspects of this approach. First, silicon dioxide is facing a fundamental scaling limit due to excessive direct tunneling current. Second, there are reliability concerns due to increased charge injection. Third, gate dopants can penetrate very thin silicon dioxide. Therefore, extensive studies have been focused on developing high dielectric constant metal oxide films to replace thermal silicon dioxide.

Performance of DRAM devices is enhanced as the unit capacitance of the stacked and trench structures are increased. To achieve this, capacitors of fin, crown, and chimney shapes have been proposed. However, the fabrication of these complex structures is difficult. Hence, as in MOSFET technology, the availability of high dielectric constant metal oxide films would improve the capability of the DRAM processes.

Many high dielectric constant gate dielectrics, such as $Ta_2O_5$, BST ($(Ba,Sr)TiO_3$), and PZT ($Pb(Zr,Ti)O_3$), have been investigated as replacements for silicon dioxide. However, $Ta_2O_5$ has serious problems such as crystallization at about 600 degrees C. and reduction by silicon. The problem of reduction by silicon causes a shortage of oxygen atoms which lowers the withstand voltage of the film. In B. Cheng et al, "The impact of high-k gate dielectrics and metal gate electrodes on sub-100 nm MOSFET's," *IEEE Transactions on Electron Devices*, Vol 46, No. 7, pp.1537–1544, it is found that BST and PZT are not only thermally unstable with a silicon substrate but also have been found to cause fringing field induced barrier lowering (FIBL). In addition, the requirement of a barrier layer between the high k dielectric and silicon further illustrates the disadvantage of these materials.

In W. Qi et al, "MOSCAP and MOSFET characteristics using $ZrO_2$ gate dielectric deposited directly on Si, *IEDM Technical Digest*, pp.145–148, (1999), and in B. Lee et al, "Ultra thin hafnium oxide with low leakage and excellent reliability for alternative gate dielectric applications," *IEDM Technical Digest*, pp. 133–136, (1999), it is found that zirconium oxide ($ZrO_2$) and hafnium oxide ($HfO_2$) show promise for future gate dielectric applications. The stability of these materials on the silicon surface and the ability to form them without the need for an interface layer, such as silicate, makes zirconium oxide and hafnium oxide good candidates to replace silicon dioxide.

Deposition of hafnium oxide and zirconium oxide is presently achieved by DC magnetron reactive sputtering or by physical vapor deposition. These methods may be suitable for blanket deposition. However, they are not suitable for difficult topologies such as the high aspect ratio trenches that are typical to DRAM and embedded DRAM technologies. The film coverage at the sidewall and bottom is insufficient using these methods. Chemical vapor deposition (CVD) at a low temperature is preferred for improving the conformal coverage of the metal oxide film. However, a new set of precursors is required.

Several prior art approaches disclose methods to form either zirconium oxide or hafnium oxide or to related technology. U.S. Pat. No. 6,020,024 to Maiti et al teaches the formation of zirconium oxide or hafnium oxide over a silicon nitride oxidation barrier. The metal oxides are formed by first sputtering the metal onto the substrate and then performing an oxidation. Alternatively, CVD may be used to deposit metal oxide followed by an oxygen anneal to reduce oxygen vacancies in the film. No details are given regarding the precursors used in CVD deposition of the metal film. U.S. Pat. No. 6,013,553 to Wallace et al teaches the formation of zirconium oxide and hafnium oxide. Hafnium or zirconium is first deposited through evaporation, sputtering, or CVD. For CVD, the precursors include hafnium tetrachloride or zirconium tetrachloride and hydrogen. Oxynitridation is achieved through direct exposure to NO or through remote plasma of nitrogen followed by oxidation. U.S. Pat. No. 5,733,661 to Ue et al teaches the formation of composite hafnium oxide and/or zirconium oxide films containing anions of organic carboxylic salts and/or inorganic oxoacid salts. The composite hafnium oxide and zirconium oxide films have relative permittivity values of between 50 and 1000, which are at least twice that of the simple oxides of hafnium and zirconium. U.S. Pat. No. 5,487,918 to Akhtar teaches the formation of hafnium oxide by reacting a hafnium substrate with hexamethyldisiloxane vapor. U.S. Pat. No. 5,443,686 to Jones et al teaches the precoating of the interior wall of a CVD reaction chamber with a thin layer of hafnium oxide or zirconium oxide, which is inert to the etching gas introduced for the removal of the silicon deposits. U.S. Pat. No. 5,405,805 to Homma teaches the exposure of zirconium oxide and hafnium oxide as insulating films in semiconductor devices to an alkoxyfluorosilane vapor to reduce water content. U.S. Pat. No. 5,405,796 to Jones, Jr. teaches the use of zirconium oxide, among other dielectric materials, as a high permittivity dielectric in the formation of a capacitor for use in a memory cell. U.S. Pat. No. 5,290,609 to Horiike et al teaches the formation of zirconium oxide or hafnium oxide as an auxiliary dielectric layer to tantalum pentoxide in a semiconductor device. Although the method of deposition of the metal oxides is CVD, no details of the precursors are given. Finally, the formation of zirconium oxide and hafnium oxide by sputtering metal followed by oxidation or by sputtering metal oxide target is practiced in the prior art.

SUMMARY OF THE INVENTION

A principal object of the present invention is to provide an effective and very manufacturable method to form high dielectric constant materials in the manufacture of an integrated circuit device.

A further object of the present invention is to provide a method to form metal oxide as a high dielectric constant material.

Another further object of the present invention is to provide a method to form composite metal oxide-silicon oxide as a high dielectric constant material.

A yet further object of the present invention is to provide precursors for the chemical vapor deposition of zirconium oxide.

Another yet further object of the present invention is to provide precursors for the chemical vapor deposition of hafnium oxide.

Another yet further object of the present invention is to provide precursors for the chemical vapor deposition of composite zirconium oxide-silicon oxide.

Another yet further object of the present invention is to provide precursors for the chemical vapor deposition of composite hafnium oxide-silicon oxide.

In accordance with the objects of this invention, a new method of forming a metal oxide high dielectric constant layer in the manufacture of an integrated circuit device has been achieved. A substrate is provided. A metal oxide layer is deposited overlying the substrate by reacting a precursor with an oxidant gas in a chemical vapor deposition chamber. The metal oxide layer may comprise hafnium oxide or zirconium oxide. The precursor may comprise metal alkoxide, metal tetraalkoxide, metal tetraalkoxide containing halogen, metal β-diketonate, metal fluorinated β-diketonate, metal oxoacid, metal acetate, or metal alkene. The metal oxide layer is annealed to cause densification and to complete the formation of the metal oxide dielectric layer in the manufacture of the integrated circuit device.

Also in accordance with the objects of this invention, a new method of forming a composite metal oxide-silicon oxide high dielectric constant layer in the manufacture of an integrated circuit device has been achieved. A substrate is provided. A metal oxide-silicon oxide layer is deposited overlying the substrate by reacting a precursor with an oxidant gas in a chemical vapor deposition chamber. The metal oxide-silicon oxide layer may comprise hafnium oxide-silicon oxide or zirconium oxide-silicon oxide. The precursor comprises metal tetrasiloxane. The metal oxide layer is annealed to cause densification and to complete the formation of the metal oxide-silicon oxide dielectric layer in the manufacture of the integrated circuit device.

BRIEF DESCRIPTION OF THE DRAWINGS

In the accompanying drawings forming a material part of this description, there is shown.

DESCRIPTION OF THE PREFERRED EMBODIMENTS

The embodiments disclose a method to form metal oxide and composite metal oxide-silicon oxide dielectric layers in the manufacture of an integrated circuit device. The present invention, in two preferred embodiments, is applied in exemplary fashion to the formation of an MOS transistor and a DRAM cell. It should be clear to those experienced in the art that the present invention can be applied and extended without deviating from the scope of the present invention.

Figure 1:
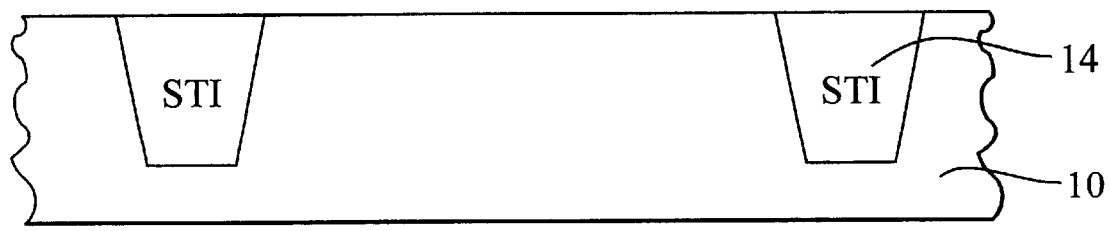
FIGS. 1 through 3 schematically illustrate in cross-sectional representation the application of the present invention to the formation of a MOSFET.

Referring now particularly to FIG. 1, there is shown a cross-sectional representation of a partially completed integrated circuit device. A substrate 10 is provided. The substrate 10 preferably comprises a semiconductor substrate such as monocrystalline silicon. Alternatively, the substrate 10 may comprise silicon-on-insulator (SOI) or silicon-on-sapphire (SOS), or silicon-germanium (SiGe). Shallow trench isolations (STI) 14 are formed in the substrate 10 to define the active regions of the integrated circuit device. Alternatively, field oxide regions, formed using a local oxidation of silicon (LOCOS) technique, could be used in place of the STI regions 14.

Figure 2:
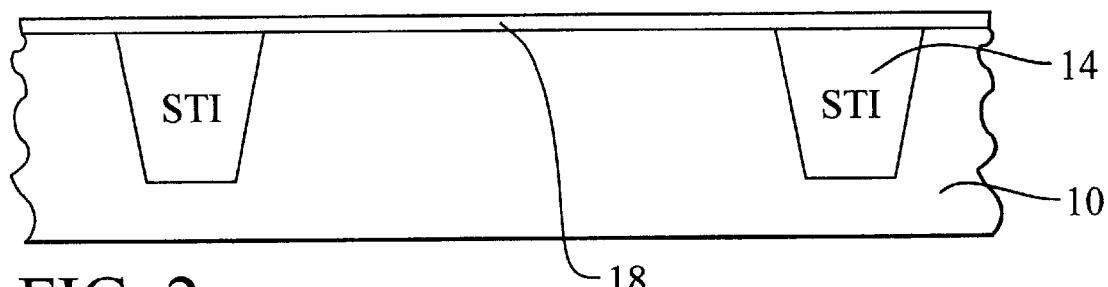

Of particular importance to the first embodiment of the present invention is the deposition of a metal oxide layer 18 overlying the substrate 10. Referring now to FIG. 2, a metal oxide layer 18 is deposited overlying the substrate 10 using a chemical vapor deposition (CVD) process. In this example, the metal oxide layer 18 will form a high dielectric constant material for the gate dielectric of the completed MOS transistor.

The metal oxide layer 18 comprises either hafnium oxide or zirconium oxide. In either case, the metal oxide is deposited overlying the substrate 10 by the reaction of a precursor, containing the metal, with an oxidant in a CVD chamber. The resulting metal oxide layer 18 conformally covers high aspect ratio topologies that prior art sputtering or PVD processes cannot cover. As will be outlined below, several unique precursors may be used in the method of the present invention. Further, the method may be used to deposit the metal oxide layer onto a variety of substrate materials.

Hafnium oxide or zirconium oxide may be deposited in this method using a precursor comprising any of the following types: metal alkoxide, metal alkoxide containing halogen, metal β-diketonate, metal fluorinated β-diketonate, metal oxoacid, metal acetate, and metal alkene. In each case, the metal component of each compound comprises either hafnium or zirconium. For example, hafnium tetraalkoxide serves as a precursor for the CVD deposition of hafnium oxide. Similarly, zirconium acetate serves as a precursor for the CVD deposition of zirconium oxide.

More particularly, the metal alkoxide precursor deposits metal oxide according to the reaction:

$$M(OR)_4 + O_2 \rightarrow MO_2 + CO_2 + H_2O,$$

where M is Hf or Zr and where R is an alkyl group or an aryl group or a combination of alkyl or aryl groups. In the process, the precursor reacts with the oxidant in the CVD chamber. The oxidant is preferably oxygen as shown in the reaction equation. Alternatively, ozone or hydrogen may be used as the oxidant gas.

In general, the metal alkoxides are liquids, which makes their transport from the container to the chamber of the CVD equipment easy. A carrier gas, for example, nitrogen, argon, or helium, can be used to dilute and flow the metal alkoxides to the reaction chamber. However, the metal alkoxides are high boiling point liquids. Therefore, low pressure and heating are required to cause vaporization.

The metal alkoxides that may be used as precursors for metal oxide deposition include the following compounds (where M is Hf or Zr): $M(OCH_3)_4$, $M(OC_3H_7)_4$, $M(O(CH_2)_3CH_3)_4$, $M(OC(CH_3)_3)_4$, $M(OCH_2CH_2CH(CH_3)_2)_4$, $M(OCH_2C(CH_3)_3)_4$, $M(OCH(CH_3)C_3H_7)_4$, $M(OC(CH_3)_2 C_2H_5)_4$, $M(OC(OCH_3)C(CH_3)_3)_4$, $M(OC(CH_3)_2(C_3H_7)_4$, $M(OCH(C_3H_7)_2)_4$, $M(OC(C_2H_5)_3)_4$, $M(OC(CH_3)(C_2H_5)(CH(CH_3)_2))_4$, $M(OC_2H_5)_4$, $M(OCH(CH_3)_2)_4$, $M(OCH(CH_3)CH_2CH_3)_4$, $M(O(CH_2)_4CH_3)_4$, $M(OCH_2CH(CH_3)CH_2CH_3)_4$, $M(OCH(C_2H_5)_2)_4$, $M(OCH(CH_3)CH(CH_3)_2)_4$, $M(OCH(CH_3)C_4H_9)_4$, $M(OC(CH_3)(C_2H_5)_2)_4$, $M(OC(CH_3)_2CH(CH_3)_2)_4$, $M(OCH(CH(CH_3)_2)_2)_4$, $M(OC(CH_3)_2C(CH_3)_3)_4$, $M(OC_6H_5)_4$.

With the exception of $Hf(OCH_3)_4$ and $Zr(OCH_3)_4$, the boiling points for the these metal alkoxides are from about 70 degrees C. to about 300 degrees C. at 0.1 mmHg. Both $Hf(OCH_3)_4$ and $Zr(OCH_3)_4$ undergo sublimation at between about 280 degrees C. and 290 degrees C. and atmospheric pressure. $Hf(OCH_3)_4$ and $Zr(OCH_3)_4$ are the preferred metal alkoxide precursors.

Metal alkoxides containing halogen may be used as the precursor for the deposition of metal oxide. These precursors are similar to the alkoxides above except that the alkyl and aryl groups incorporate halogen atoms. Examples of these precursors include, but are not restricted to, $M(OCH_2CF_3)_4$, $M(OCH(CF_3)_2)_4$, and $M(OC(CH_3)_2CCl_3)_4$. Once again, zirconium oxide or hafnium oxide is formed by reacting these precursors with an oxidant such as oxygen or ozone.

Metal β-diketonate precursors are of the form $M(RCOCHCOR)_4$, where R is an alkyl group or an aryl group or a combination of alkyl or aryl groups. The typical reaction is given by:

$$M(RCOCHCOR)_4 + O_2 \rightarrow MO_2 + CO_2 + H_2O$$

where M is Zr or Hf. In the CVD chamber, an oxidant such as oxygen or ozone reacts with the metal β-diketonate precursor to form the metal oxide on the substrate. An example of a metal β-diketonate precursor is metal acetylacetonate or $M(CH_3COCHCOCH_3)_4$.

Metal fluorinated β-diketonate precursors can also react with oxygen in a CVD chamber to form metal oxide. Metal fluorinated β-diketonate precursors are of the form $M(RCOCHCOR)_4$ where R is an alkyl or an aryl group that contains fluorine. An example of a metal fluorinated β-diketonate is metal hexafluoro 2,4-pentanedionate or $M(CF_3COCHCOCF_3)_4$. Mixed fluorinated β-diketonate, where one R group is fluorinated while the second group is not fluorinated, may also be used as a precursor. For example, metal trifluoroacetylacetonate, or $M(CF_3COCHCOCH_3)_4$, may be used.

Metal oxoacid precursors may be used to deposit metal oxide in a CVD chamber. A metal oxoacid is of the form MO(A), where A is the conjugate base of the acid. The metal oxoacid is reacted with oxygen or ozone to form metal oxide on the substrate. Examples of metal oxoacids include $MO(CH_3COO)_2$, $MOCl_2$, and $MO(CF_3SO_3)_2$.

Metal acetates, such as hafnium acetate ($Hf(CH_3COO)_4$) and zirconium acetate ($Zr(CH_3COO)_4$) may be used as precursors for metal oxide deposition. The metal acetate reacts with oxygen or ozone in the CVD chamber to deposit metal oxide on the substrate.

Finally, metal alkene precursors may be used to deposit metal oxides on the substrate in a CVD chamber. Alkene ligands include, but are not restricted to, cyclopentadiene and cyclooctadiene metal alkenes that react with oxygen to deposit metal oxide.

In all of the above precursors of the first embodiment of the present invention, hafnium oxide or zirconium oxide is preferably deposited in a low pressure chemical vapor deposition (LPCVD) or an atmospheric pressure chemical vapor deposition (APCVD) process. The preferred source vessel temperature is between about 30 degrees C. and 250 degrees C. The preferred source carrier gas is either nitrogen, argon, or helium. The preferred pressure is between about 0.1 mTorr and 760 Torr. The preferred wafer temperature is between about 100 degrees C. and 650 degrees C. The preferred carrier gas flow rate is between about 100 sccm and 5,000 sccm. The preferred oxidant gas flow rate is between about 50 sccm and 10,000 sccm. The preferred diluent gas flow rate is between about 1,000 sccm and 50,000 sccm.

After the chemical vapor deposition of the metal oxide layer 18, the metal oxide layer 18 is annealed to cause densification. This completes the formation of the metal oxide layer 18 in the manufacture of the integrated circuit device. Annealing may be performed in a furnace or in rapid thermal annealing (RTA) equipment. The anneal is preferably performed in the presence of oxygen or ozone. The wafer temperature is preferably between about 200 degrees C. and 900 degrees C. The annealing pressure is preferably between about 10 Torr and 760 Torr. The oxidant gas flow rate is preferably between about 10 sccm and 1,000 sccm.

The preferred thickness of the metal oxide layer 18, deposited by the method of the first embodiment of the present invention, is between about 20 Angstroms and 150 Angstroms. Hafnium oxide formed by this method has a dielectric constant of between about 20 and 40. Zirconium oxide has a dielectric constant of between about 15 and 30. By comparison, silicon dioxide has a dielectric constant of about 3.9.

Figure 3:
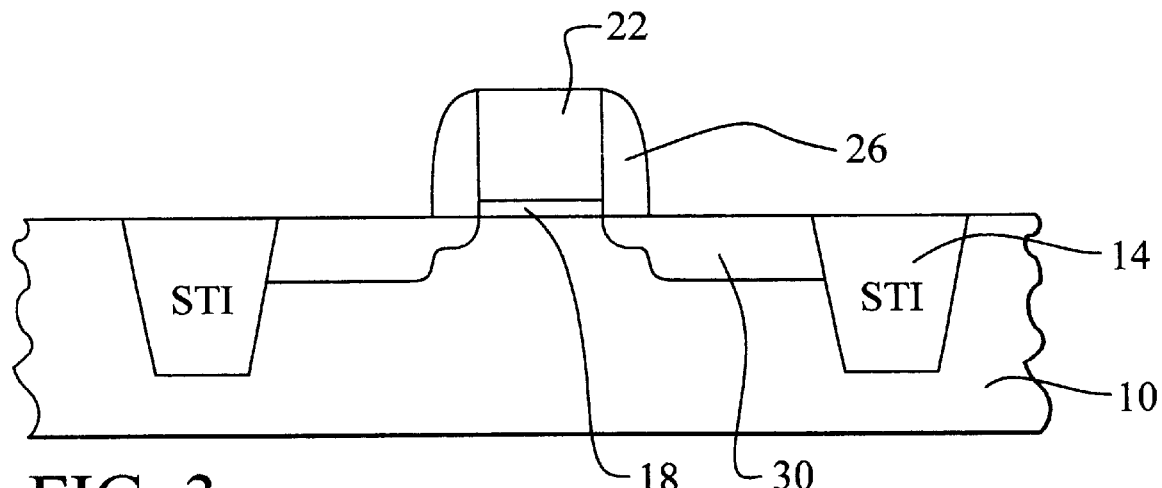

Referring now to FIG. 3, following the completion of the metal oxide layer 18, the MOSFET is completed. For example, a polysilicon layer 22 is deposited overlying the metal oxide layer 18. The polysilicon layer is patterned to form gates for the MOSFET devices. Drain extensions are implanted prior to the formation of sidewall spacers 26 on the polysilicon gates 22. Heavily doped source and drain junctions 30 are implanted to complete the MOSFET devices. The metal oxide layer 18 forms a high dielectric constant insulator between the polysilicon layer 22 and the substrate 10. The metal oxide layer 18 may be formed thicker than a comparable silicon oxide while creating a MOSFET device with a greater $I_{dsat}$. Reliability and performance are thereby enhanced.

Figure 4:
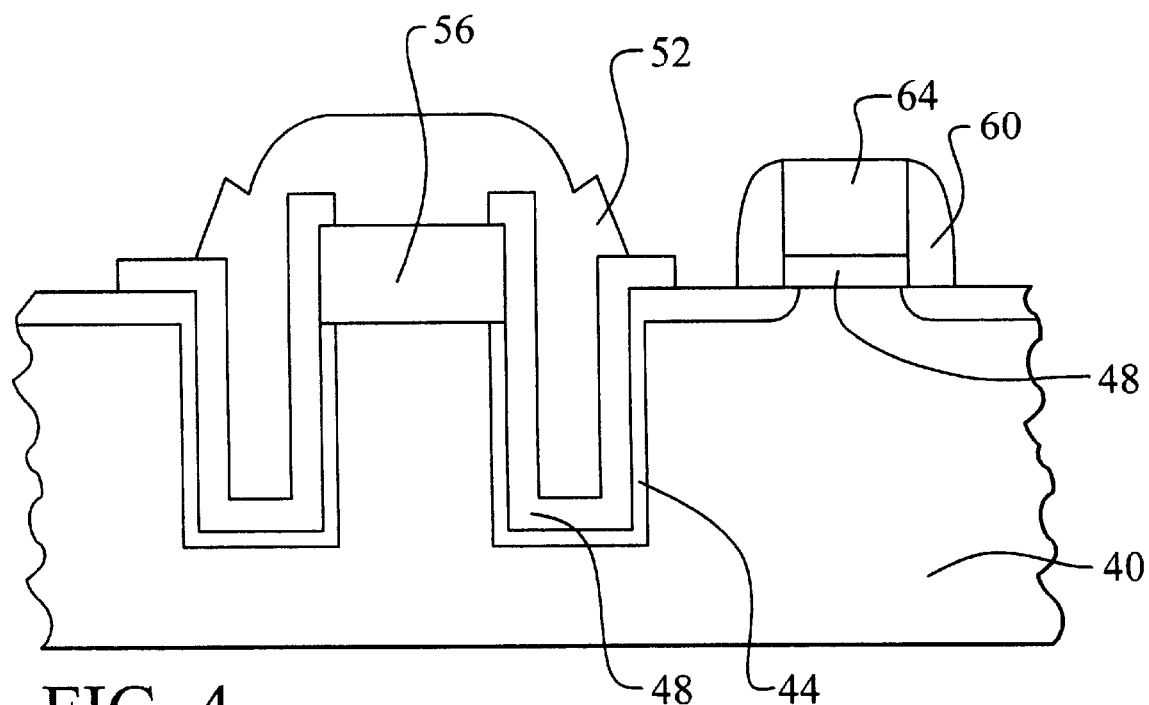
FIG. 4 schematically illustrates in cross-sectional representation the application of the present invention to the formation of a DRAM.

Referring to FIG. 4, an alternative application of the first preferred embodiment of the present invention is shown. A DRAM cell is shown. Most particularly, a metal oxide layer 48 is used in the cell capacitor and the transistor. In cell capacitor, trenches are etched into the substrate 40. A first polysilicon layer 44 is deposited to line the trenches and form the bottom plate. A metal oxide layer 48, comprising hafnium oxide or zirconium oxide, is deposited by the method of the first embodiment to line the trenches overlying the bottom plate 44. In addition, the metal oxide layer 48 is deposited overlying the substrate 40 to form the gate insulator for the transistor. An insulator structure 56 and a top plate 52 are formed to complete the capacitor structure. A gate electrode 64 and sidewall spacers 60 are formed on the DRAM transistor. The DRAM transistor gate 64 and 60 controls the DRAM cell. In this scheme, the advantages of the novel, metal oxide layer 48 are available for both the capacitor cell and the transistor cell of the DRAM device.

The method of the first embodiment of the present invention is particularly advantageous in this example. The high aspect ratio trenches present a difficult topology for void free deposition using either sputtering or PVD. Because of the novel precursors of the present invention, a CVD process may be used to deposit the metal oxide layer 48 without creating shorts. Following the anneal process, the metal oxide layer 48 is patterned, and then a second polysilicon layer 52 is deposited to provide a top plate for the cell capacitor. The metal oxide layer 48 allows the creation of a greater unit capacitance capacitor for the DRAM cell. Data retention and cell size are thereby improved.

The second preferred embodiment of the present invention concerns the formation of a composite, metal oxide-silicon oxide layer ($MO_2$-$SiO_2$) through the reaction of the preferred precursor with an oxidant in a chemical vapor deposition chamber. The composite metal oxide-silicon oxide thus formed has a dielectric constant of between about 5 and 20 for zirconium oxide-silicon oxide and of between about 10 and 25 for hafnium oxide-silicon oxide.

The preferred precursor for the formation of composite metal oxide-silicon oxide ($MO_2$-$SiO_2$) is metal tetrasiloxane, or $M(OSiR)_4$ where M is hafnium or zirconium and R is an alkyl group or an aryl group. The metal tetrasiloxane reaction is given by:

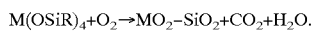

$$M(OSiR)_4 + O_2 \rightarrow MO_2\text{-}SiO_2 + CO_2 + H_2O.$$

The metal tetrasiloxane precursors include, but are not limited to, the group comprising: $M(OSi(CH_3)_3)_4$, $M(OSi(CH_2CH_3)_3)_4$, $M(OSi(CH_3)_2CH_2CH_3)_4$, $M(OSi(CH_3)_2((CH_2)_2CH_3))_4$, $M(OSi(CH_3)_2(CH(CH_3)_2))_4$, $M(OSiCH_3(CH_2CH_3)_2)_4$. With the exception of $Hf(OSi(CH_3)_3)_4$ and $Zr(OSi(CH_3)_3)_4$, the boiling points of these metal tetrasiloxanes are from between about 100 degrees C. and 200 degrees C. at 0.1 mmHg. $Hf(OSi(CH_3)_3)_4$ and $Zr(OSi(CH_3)_3)_4$ are the preferred precursors for the second embodiment and undergo sublimation at between about 135 degrees C. and 140 degrees C.

The composite hafnium oxide-silicon oxide or zirconium oxide-silicon oxide layer is preferably formed in a low pressure chemical vapor deposition (LPCVD) chamber or an atmospheric pressure chemical vapor deposition (APCVD) chamber. The preferred source vessel temperature is between about 30 degrees C. and 250 degrees C. The preferred carrier gas is nitrogen, argon or helium. The preferred pressure is between about 0.1 mTorr and 760 Torr. The preferred wafer temperature is between about 100 degrees C. and 650 degrees C. The preferred carrier gas flow rate is between about 100 sccm and 5,000 sccm. The preferred oxidant gas is oxygen or ozone. The preferred oxidant gas flow rate is between about 50 and 10,000 sccm. The preferred diluent gas flow rate is between about 1,000 and 50,000 sccm.

After the CVD deposition of the composite metal oxide-silicon oxide layer, an anneal is performed to densify the composite metal oxide-silicon oxide. The anneal may be performed in a furnace or in a RTA chamber in the presence of oxygen or ozone. The preferred anneal wafer temperature is between about 200 degrees C. and 1,000 degrees C. The preferred annealing pressure is between about 10 Torr and 760 Torr. The preferred oxidant flow rate is between about 10 sccm and 1,000 sccm. The composite metal oxide-silicon oxide is deposited by this method to a thickness of between about 10 and 100 Angstroms.

The second embodiment may be applied to the MOSFET of FIGS. 1 through 3 or to the DRAM of FIG. 4. A high dielectric constant composite metal oxide-silicon oxide layer 18 or 48 is thereby available in a CVD process.

It should be noted that the deposition of metal oxide or composite metal oxide-silicon oxide using the precursors of the first or second embodiments may occur on a variety of film substrates. For example, the metal oxide or composite metal oxide-silicon oxide film may be thus deposited onto silicon, silicon nitride, silicon dioxide, silicon oxynitride, metals, metal oxides (other than hafnium oxide and zirconium oxide), metal silicates, and others. In addition, the deposition of metal oxides and composite metal oxide-silicon oxides is not restricted to MOSFETs and DRAM capacitors.

As shown in the preferred embodiments, the present invention provides a very manufacturable process for forming high dielectric constant metal oxides in the manufacture of a semiconductor device. A first embodiment discloses a variety of classes of novel precursors for the CVD deposition of hafnium oxide and zirconium oxide by reaction with an oxidant. A second embodiment discloses a class of precursors for the CVD deposition of composite hafnium oxide-silicon oxide and composite zirconium oxide-silicon oxide by reaction with an oxidant. In each embodiment, an anneal is performed to densify the metal oxide dielectric. The conformal deposition advantage of CVD are thereby achieved in a metal oxide deposition process.

While the invention has been particularly shown and described with reference to the preferred embodiments thereof, it will be understood by those skilled in the art that various changes in form and details may be made without departing from the spirit and scope of the invention.

What is claimed is:

1. A method to form a metal oxide dielectric layer in the manufacture of an integrated circuit device comprising:

providing a substrate;

depositing a metal oxide layer overlying said substrate by reacting a precursor with an oxidant gas in a chemical vapor deposition chamber wherein said metal oxide comprises one of the group of: hafnium oxide and zirconium oxide, wherein said precursor comprises one of the group of: hafnium alkoxide, hafnium alkoxide containing halogen, hafnium β-diketonate, hafnium fluorinated β-diketonate, hafnium oxoacid, hafnium acetate, hafnium alkene, zirconium alkoxide, zirconium alkoxide containing halogen, zirconium β-diketonate, zirconium fluorinated β-diketonate, zirconium oxoacid, zirconium acetate, and zirconium alkene, and wherein said metal oxide is not doped by another metal; and annealing said metal oxide layer to cause densification and to complete the formation of said metal oxide dielectric layer in the manufacture of said integrated circuit device.

2. The method according to claim 1 wherein said metal oxide comprises hafnium oxide.

3. The method according to claim 2 wherein said precursor comprises one of the group of: hafnium alkoxide, hafnium alkoxide containing halogen, hafnium β-diketonate, hafnium fluorinated β-diketonate, hafnium oxoacid, hafnium acetate, and hafnium alkene.

4. The method according to claim 1 wherein said metal oxide comprises zirconium oxide.

5. The method according to claim 4 wherein said precursor comprises one of the group of: zirconium alkoxide, zirconium alkoxide containing halogen, zirconium β-diketonate, zirconium fluorinated β-diketonate, zirconium oxoacid, zirconium acetate, and zirconium alkene.

6. The method according to claim 1 wherein said oxidant comprises one of the group of: oxygen, ozone, and hydrogen.

7. The method according to claim 1 wherein said annealing is performed in the presence of one of the group of: oxygen and ozone.

8. The method according to claim 1 wherein said substrate comprises one of the group of: silicon, silicon nitride, silicon dioxide, silicon oxynitride, metal, metal oxide, and metal silicate.

9. A method to form a metal oxide dielectric layer in the manufacture of an integrated circuit device comprising:

providing a substrate;

depositing a metal oxide layer overlying said substrate by reacting a precursor with an oxidant gas in a chemical vapor deposition chamber wherein said metal oxide comprises one of the group of: hafnium oxide and zirconium oxide, and wherein said metal oxide is not doped by another metal, and wherein said precursor comprises one of the group of: hafnium alkoxide, hafnium alkoxide containing halogen, hafnium β-diketonate, hafnium fluorinated β-diketonate, hafnium oxoacid, hafnium acetate, hafnium alkene, zirconium alkoxide, zirconium alkoxide containing halogen, zirconium β-diketonate, zirconium fluorinated β-diketonate, zirconium oxoacid, zirconium acetate, and zirconium alkene; and annealing said metal oxide layer to cause densification and to complete the formation of said metal oxide dielectric layer in the manufacture of said integrated circuit device.

10. The method according to claim 9 wherein said oxidant comprises one of the group of: oxygen, ozone, and hydrogen.

11. The method according to claim 9 wherein said annealing is performed in the presence of one of the group of: oxygen and ozone.

12. The method according to claim 9 wherein said substrate comprises one of the group of: silicon, silicon nitride, silicon dioxide, silicon oxynitride, metal, metal oxide, and metal silicate.

13. A method to form a metal oxide-silicon oxide dielectric layer in the manufacture of an integrated circuit device comprising:

providing a substrate;

depositing a metal oxide-silicon oxide layer overlying said substrate by reacting a precursor with an oxidant gas in a chemical vapor deposition chamber wherein said precursor comprises metal tetrasiloxane; and annealing said metal oxide-silicon oxide layer to cause densification and to complete the formation of said metal oxide-silicon oxide dielectric layer in the manufacture of said integrated circuit device.

14. The method according to claim 13 wherein said metal oxide-silicon oxide comprises hafnium oxide-silicon oxide.

15. The method according to claim 14 wherein said precursor comprises one of the group of: $Hf(OSi(CH_3)_3)_4$, $Hf(OSi(CH_2CH_3)_3)_4$, $Hf(OSi(CH_3)_2CH_2CH_3)_4$, $Hf(OSi(CH_3)_2((CH_2)_2CH_3))_4$, $Hf(OSi(CH_3)_2(CH(CH_3)_2)_4$, and $Hf(OSiCH_3(CH_2CH_3)_2)_4$.

16. The method according to claim 13 wherein said metal oxide-silicon oxide comprises zirconium oxide-silicon oxide.

17. The method according to claim 16 wherein said precursor comprises one of the group of: $Zr(OSi(CH_3)_3)_4$, $Zr(OSi(CH_2CH_3)_3)_4$, $Zr(OSi(CH_3)_2CH_2CH_3)_4$, $Zr(OSi(CH_3)_2((CH_2)_2CH_3))_4$, $Zr(OSi(CH_3)_2(CH(CH_3)_2)_4$, and $Zr(OSiCH_3(CH_2CH_3)_2)_4$.

18. The method according to claim 13 wherein said oxidant comprises one of the group of: oxygen and ozone.

19. The method according to claim 3 wherein said annealing is performed in the presence of one of the group of: oxygen and ozone.

20. The method according to claim 13 wherein said substrate comprises one of the group of: silicon, silicon nitride, silicon dioxide, silicon oxynitride, metal, metal oxide, and metal silicate.

* * * * *